(12) United States Patent
Namura et al.

(10) Patent No.: US 7,752,513 B2
(45) Date of Patent: Jul. 6, 2010

(54) METHOD AND CIRCUIT FOR LSSD TESTING

(75) Inventors: Ken Namura, Kanagawa-ken (JP);
Sanae Seike, Kanagawa-ken (JP);
Toshihiko Yokota, Kyoto (JP)

(73) Assignee: International Business Machines Corporation, Armonk, NY (US)

( * ) Notice: Subject to any disclaimer, the term of this patent is extended or adjusted under 35 U.S.C. 154(b) by 705 days.

(21) Appl. No.: 11/672,072

(22) Filed: Feb. 7, 2007

(65) Prior Publication Data

US 2007/0198882 A1    Aug. 23, 2007

(30) Foreign Application Priority Data

Feb. 17, 2006    (JP) .............................. 2006-041535

(51) Int. Cl.
*G01R 31/28* (2006.01)

(52) U.S. Cl. .......................... 714/726; 714/25; 714/30; 714/707; 714/724; 714/727; 714/729; 714/731; 714/744

(58) Field of Classification Search ........................ None
See application file for complete search history.

(56) References Cited

U.S. PATENT DOCUMENTS

| | | | | |
|---|---|---|---|---|
| 6,115,827 A | * | 9/2000 | Nadeau-Dostie et al. | .... 713/503 |
| 6,131,173 A | * | 10/2000 | Meirlevede et al. | ......... 714/726 |
| 6,275,081 B1 | | 8/2001 | Flake | |
| 6,327,684 B1 | * | 12/2001 | Nadeau-Dostie et al. | .... 714/731 |
| 6,442,722 B1 | * | 8/2002 | Nadeau-Dostie et al. | .... 714/731 |
| 6,598,192 B1 | | 7/2003 | McLaurin et al. | |
| 7,120,844 B2 | * | 10/2006 | Wu | ............ 714/731 |
| 2005/0276321 A1 | * | 12/2005 | Konuk | ........ 375/224 |
| 2006/0026473 A1 | * | 2/2006 | Tan | ............ 714/726 |
| 2007/0186132 A1 | * | 8/2007 | Dingemanse | ............... 714/726 |

FOREIGN PATENT DOCUMENTS

| | | |
|---|---|---|
| JP | 2001-004710 | 1/2001 |
| JP | 2002323540 | 11/2002 |
| JP | 2003202362 | 7/2003 |
| WO | WO 2005071426 | 8/2005 |

* cited by examiner

*Primary Examiner*—John P Trimmings
(74) *Attorney, Agent, or Firm*—Schmeiser, Olsen & Watts

(57) ABSTRACT

A method and integrated circuit for LSSD testing. The integrated circuit includes a plurality of clock domains supplied with test clocks from separate clock generation circuits. In each clock domain, a scan latch at a clock domain boundary receiving an input from another clock domain includes a master latch for latching an input in response to a first clock, a slave latch for latching an output from the master latch in response to a second clock, a selector for supplying the master latch with a system input when the mode selection signal is at a second level, and a clock control circuit for turning off the first clock when the mode selection signal transits from the first level to the second level.

10 Claims, 4 Drawing Sheets

SCAN LATCH 20B'

SCAN LATCH 20B'

METHOD AND CIRCUIT FOR LSSD TESTING

FIELD OF THE INVENTION

The present invention relates the field of a level sensitive scan design (LSSD) testing integrated circuits. More specifically, the present invention relates to LSSD testing when the scan chain comprises latches clocked by test clocks in two or more time domains.

BACKGROUND OF THE INVENTION

Integrated circuits are used for varieties of products, and many integrated circuits include complicated combinational logic circuits. Such combination logic is often tested with LSSD. LSSD uses sequential scan latches having a shift function to test the combinational circuits, in which a test pattern is scanned in to the combinational circuits and a resultant pattern is scanned out, with scan-in and scan-out controlled by controlled by a clock signal.

To test the combinational logic at the operating frequency, test data is loaded into the scan latches using a scan clock but transfer across the combinational logic from a sending latch to a receiving latch using a clock running at the operational frequency of the combinational logic (the scan clock has a frequency lower than the operational frequency). When, LSSD testing is performed at the operating frequency of the combinational logic using scan latch chains that cross two or more time domains, each running at a different operational frequency, a problem arises of synchronizing data transfer from the last latch in the first time domain to a first latch in the second time domain at the boundary where the scan chain crosses the different time domains. Therefore, there is a need for method and circuit for synchronizing data transfer from the last latch in the first time domain to a first latch in the second time domain when a scan chain crosses different time domains.

SUMMARY OF THE INVENTION

A first aspect of the present invention is an integrated circuit, comprising: a first clock generation circuit configured to generate a first domain clock signal and a second clock generation signal configured to generate a second domain clock signal; a first set of scan latches connected in series from a first scan latch to a last scan latch, each scan latch of the first set of scan latches configured to receive the first clock signal and to latch either data presented at a scan input of each latch of the first set of latches or data presented at a system input of each latch of the first set of latches in response to a level of a mode selection signal; a second set of scan latches connected in series from a first scan latch to a last scan latch, each scan latch of the second set of scan latches configured to receive the first clock signal and to latch either data presented at a scan input of each latch of the second set of latches or data presented at a system input of each latch of the second set of latches in response to the level of the mode selection signal; and the first scan latch of the second set of scan latches comprising: a master latch configured to latch data at an input in response to a first clock signal; a slave latch configured to latch data at an output from the master latch in response to a second clock signal; a selector configured to present at an input of the master latch the data presented at the scan input when the mode selection signal is at a first level and to present at the input of the master latch the data presented at the system input when the mode selection signal is at a second level; and a clock control circuit configured to turn off the first clock signal when the mode selection signal transits from the first level to the second level.

A second aspect of the present invention is a method comprising: generating a first domain clock signal with a first clock generation circuit and a second a second domain clock signal with a first clock generation circuit; providing a first set of scan latches connected in series from a first scan latch to a last scan latch, each scan latch of the first set of scan latches receiving the first clock signal and latching either data presented at a scan input of each latch of the first set of latches or data presented at a system input of each latch of the first set of latches in response to state of a mode selection signal; providing a second set of scan latches connected in series from a first scan latch to a last scan latch, each scan latch of the second set of scan latches receiving the first clock signal and latching either data presented at a scan input of each latch of the second set of latches or data presented at a system input of each latch of the second set of latches in response to the level of the mode selection signal; latching data presented at an input of a master latch of the first scan latch of the second set of scan latches in response to a first clock signal; latching data presented at an input of a slave latch of the first scan latch of the second set of scan latches in response to a second clock signal; presenting at the input of the master latch the data presented at the scan input when the mode selection signal is at a first level and presenting at the input of the master latch the data presented at the system input when the mode selection signal is at a second level; and turning off the first clock signal when the mode selection signal transits from the first level to the second level.

A third aspect of the present invention is An integrated circuit, comprising: a first clock generation circuit, an output of the first clock generation circuit coupled to a first input of a first selector, a scan clock signal connected to a second input of the first selector and a scan gate signal connected to a control input of the selector; a first set of scan latches connected in series from a first scan latch to a last scan latch, an output of a previous latch connected to a scan input of an immediately subsequent scan latch, each scan latch of the first set of scan latches having a scan input, a system input, a control input coupled to an output of the first selector, and an output; a second clock generation circuit, an output of the second clock generation circuit coupled to a first input of a second selector, the scan clock signal connected to a second input of the second selector and the scan gate signal connected to a control input of the second selector; a second set of scan latches connected in series from a first scan latch to a last scan latch, an output of a previous scan latch connected to a scan input of an immediately subsequent scan latch, each scan latch of the second set of scan latches having a scan input, a system input, a control input coupled to an output of the second selector and an output; and an output of the last scan latch of the first set of scan latches connected to a scan input and a system input of the first latch of the second set of scan latches, the first scan latch of the second set of scan latches comprising: a first clock control circuit having a first input connected to the gate control signal, and a second input connected to the output of the second clock generation unit; a third selector comprised of the scan and system inputs, a control input of the third selector connected to the scan gate control signal and an output; a master latch having an input, a clock input connected to an output of the third selector and having a clock input connected to an output of the clock control circuit; a slave latch having an input connected to an output of the master latch and having a clock input connected to an output of the output of the second clock generation unit.

DETAILED DESCRIPTION OF THE INVENTION

Figure 1:
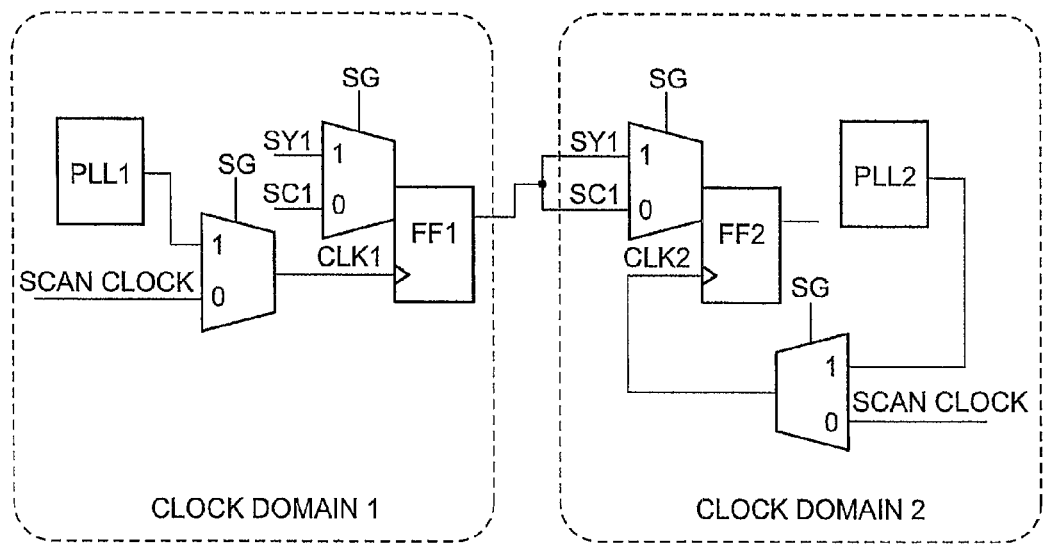
FIG. 1 is a circuit block diagram showing scan latches on sending and receiving sides at a clock domain boundary.
Figure 2:
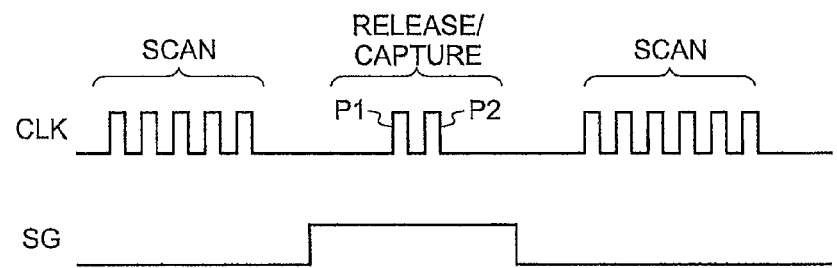
FIG. 2 is a waveform diagram showing a clock signal and a scan gate signal for controlling the scan latches of FIG. 1.

FIG. 1 is a circuit block diagram showing scan latches on sending and receiving sides at a clock domain boundary and FIG. 2 is a waveform diagram showing a clock signal and a scan gate signal for controlling the scan latches of FIG. 1. FIG. 1 shows a clock domain boundary wherein an output from a scan latch FF1 in a clock domain 1 including phase locked loop (PLL)1 is connected to both of a scan input SCI and a system input SYI of a scan latch FF2 in a clock domain 2 including PLL2. FIG. 2 shows waveforms of a clock CLK supplied to the scan latch and a scan gate signal SG for switching between the scan input SCI and the system input SYI to the scan latch. The scan clock CLK received by each scan latch is a scan clock from the outside the clock domain when the scan gate signal SG is in the low level, and is a release/capture clock from the PLL when the scan gate signal SG is in the high level. Each PLL is designed to generate a release/capture clock composed of two pulses P1 and P2 in response to a rising transition of the scan gate signal SG. However, since the time for the release/capture clock to arrive at the scan latch depends on the number of stages of a clock tree between the PLL and the scan latch and other factors, it is impossible to ensure a match between the time for a release/capture clock from the PLL1 to arrive at the scan latch FF1 and the time for a release/capture clock from the PLL2 to arrive at the scan latch FF2.

For example, assume that the last scan data from the scan latch FF1 is received by the scan latch FF2 and then released from the scan latch FF2 in response to the subsequent release/capture clock. At this time, the scan gate signal SG goes to the high level to indicate the normal operation mode, and accordingly, the scan latch FF2 is ready for receiving the system input SYI. With the release/capture clock arriving at to the scan latch FF2 earlier than the release/capture clock arrives at the scan latch FF1, the scan latch FF2 can correctly release scan data. However, if the release/capture clock arrives later, the data released by the scan latch FF1 and captured by the scan latch FF2 is through system input SYI and which is then released by the scan latch FF2. The same applies when the system input SYI and the scan input SCI to the scan latch FF2 are separately connected to outputs of two different scan latches contained in the clock domain 1.

Figure 3:
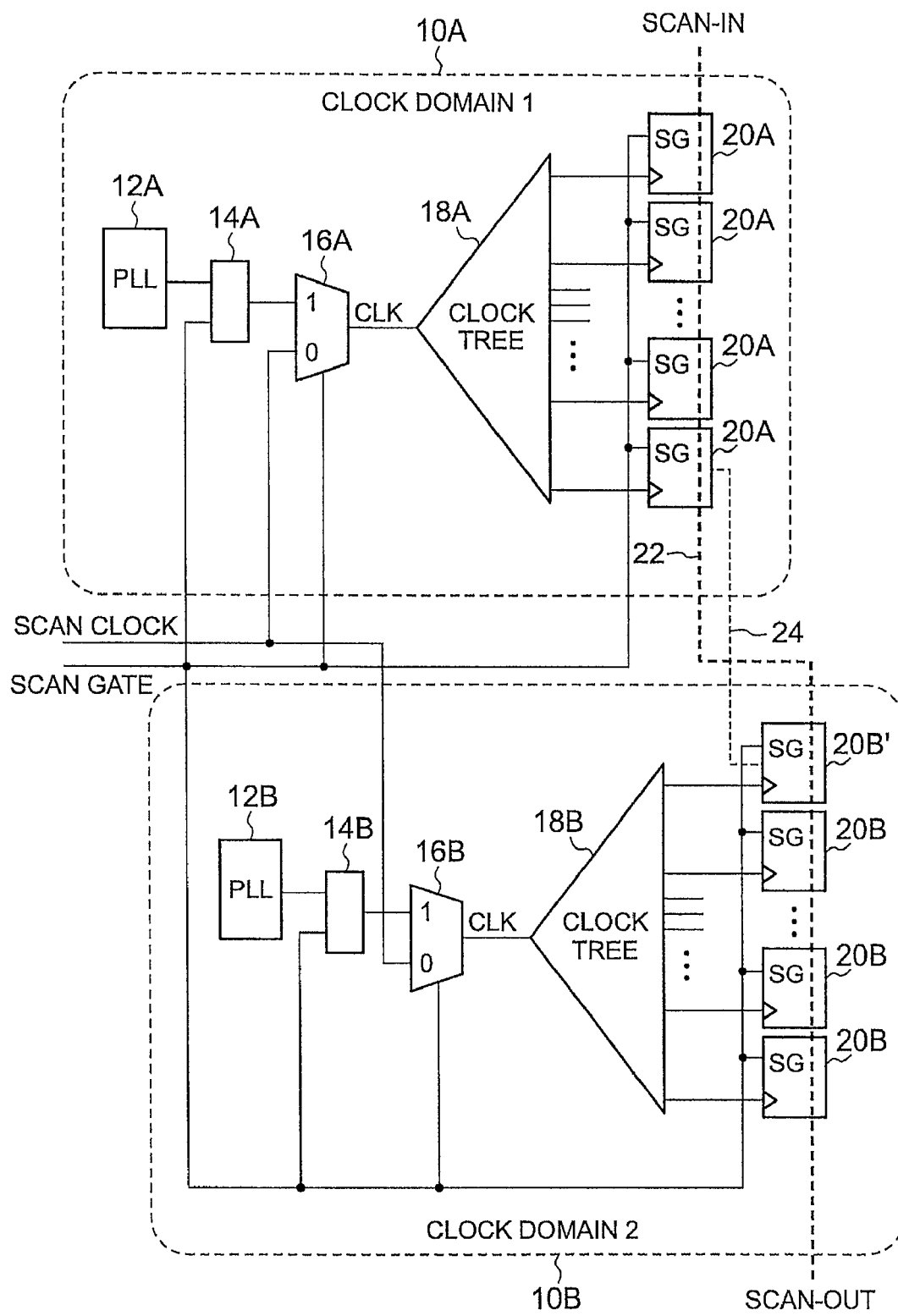
FIG. 3 is a circuit block diagram showing the test construction of an integrated circuit according to the present invention.

FIG. 3 shows an example of a construction of a test part of an integrated circuit according to the invention. The integrated circuit in FIG. 3 includes two clock domains 10A and 10B having separate PLLs 12A and 12B, respectively. The clock domains 10A and 10B have basically the same construction, and each further includes, a 2-respective pulse generators 14A and 14B each generating a 2-pulse release/capture clock from the output of the respective PLLs 12A and 12B in response to a rising transition of a scan gate signal SG, a respective selectors 16A and 16B for selecting either the release/capture clock or a scan clock from outside the respective domains in response to the scan gate signal SG, respective clock trees 18A and 18B for distributing the clock CLK from respective selectors 16A and 16B to scan respective latches 20 (29A and 20B). Respective PLLs 12A and 12B, respective 2-pulse generators 14A and 14B, and respective selectors 16A and 16B a comprise clock generation circuits. The scan clock and the scan gate signal are common to both clock domains 10A and 10B and are supplied from an external test apparatus (not shown). The heavy dashed line 22 in FIG. 3 indicates a scan path from the clock domain 10A to the clock domain 10B, and the light dashed line 24 indicates a functional path from the scan latch 20A in the clock domain 10A to the scan latch 20B in the clock domain 10B. The functional path 24 supplies the system input from the clock domain 10A to the clock domain 10B. In FIG. 3, to avoid the drawing from being complicated, a circuit to be tested (normally a combinational logic circuit) and a scan input SCI and a system input SYI to each scan latch are omitted.

Figure 4:
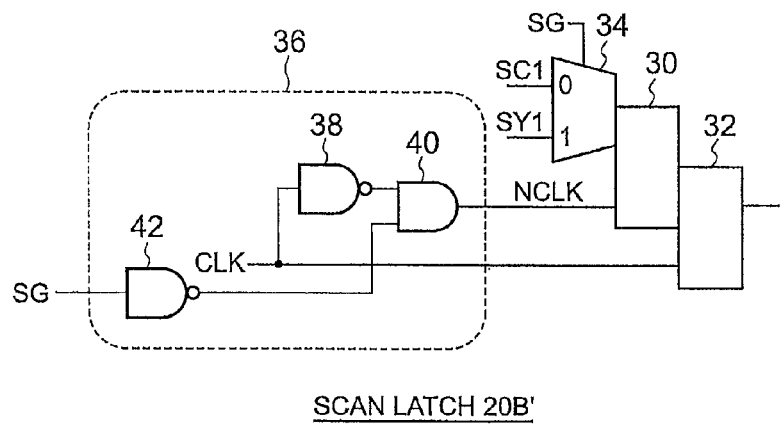
FIG. 4 is a circuit block diagram showing an embodiment of a receiving-side scan latch according to the present invention at a clock domain boundary.

The invention solves the problem of synchronizing data transfer from the last latch in the first time domain to a first latch in the second time domain when a scan chain crosses different time domains by using the latch illustrated in FIG. 4 and described infra as the receiving-side scan latch at the clock domain boundary, i.e., the leading scan latch 20B' in the clock domain 10B.

Figure 5:
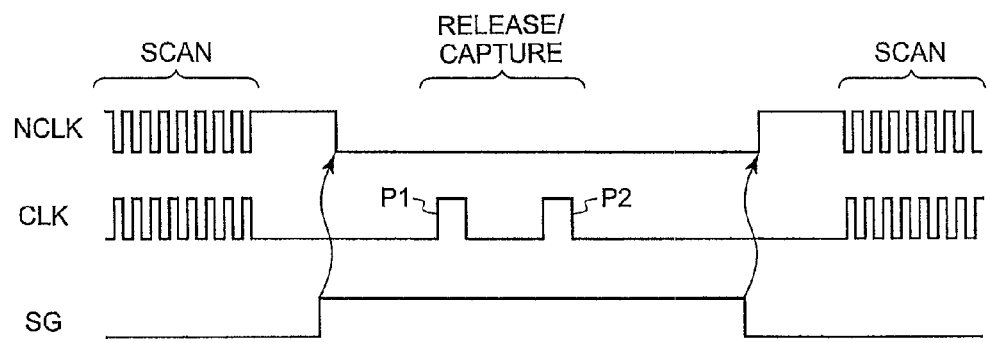
FIG. 5 is a waveform diagram showing a clock signal and a scan gate signal for controlling the scan latch of FIG. 4.

FIG. 4 is a circuit block diagram showing an embodiment of a receiving-side scan latch according to the present invention at a clock domain boundary and FIG. 5. is a waveform diagram showing a clock signal and a scan gate signal for controlling the scan latch of FIG. 4. The scan latch in FIG. 4 includes a master latch 30 for latching the input in response to a first clock NCLK, a slave latch 32 for latching the output from the master latch 30 in response to a second clock CLK, a selector 34 for supplying the master latch 30 with a scan input SCI when the scan gate signal SG serving as a mode selection signal is at a first logical level ('0') and supplying the master latch 30 with a system input SYI when the scan gate signal SG is at a second logical level ('1'), and a clock control circuit 36 for turning off the first clock NCLK when the scan gate signal SG transits from the first level to the second level. The second clock CLK is supplied from the selector 16B (see FIG. 3). In the present embodiment, it is assumed that the scan input SCI and the system input SYI of the scan latch 20B' are connected to the output of the last scan latch 20A in the clock domain 10A.

The clock control circuit 36 includes an inverting circuit 38 for inverting the second clock CLK, an AND gate 40 having a first input receiving the output from the inverting circuit 38 and a second input, and a gate control circuit 42 for disabling the second input to the AND gate 40 when the scan gate signal SG transits from the first level to the second level. An output from the AND gate 40 becomes the first clock NCLK. The gate control circuit 42 is an inverting circuit in the example of FIG. 4. The operation of the scan latch of FIG. 4 will be understood by reference to a the waveform diagram in FIG. 5.

Since the scan gate signal SG is initially at the first level, e.g., the low level, and the second input of the AND gate 40 is conditioned by the output of the inverting circuit 42, the AND gate 40 generates the first clock NCLK (which is an inverted second clock CLK) by the action of the inverting circuit 38, and supplies the first clock NCLK to the master latch 30. As a result, the master latch 30 and the slave latch 32 are successively enabled and the scan data from the scan latch 20A of the clock domain 10A is delivered to the subsequent scan latch 20B.

When the scan mode terminates and the scan gate signal SG goes to the second level, i.e., the high level, the second input of the AND gate 40 is disable by the output of the inverting circuit 42, the first clock NCLK is turned off, and this state is maintained afterwards until the scan gate signal SG goes to the low level again. At this time, the master latch 30 holds the scan data loaded by the last first clock NCLK. By the rise of the scan gate signal SG, the clock generation circuit generates a release/capture clock composed of two pulses P1 and P2, so the slave latch 32 releases the scan data held by the master latch 30. At this time, even if the release/capture clock may arrive at the scan latch 20B' later than the arrival of the release/capture clock at the sending-side scan latch 20A included in the clock domain 10A, the master latch 30 does not receive the data released from the sending-side scan latch 20A of the clock domain 10A before the scan data is released since the first clock is off.

As described supra, the scan latch in FIG. 4 can correctly release the last loaded scan data irrespectively of the arrival time of the release/capture clock. However, since the first clock NCLK remains off while the scan gate signal SG is at the high level, any valid data existing at the system input SYI is not loaded into the master latch 30, and thus the functional path 24 of FIG. 3 cannot be tested. However, it is possible to test a the path 24 (see FIG. 3) within the domain following the scan latch 20B' and minimize a the loss in test coverage by replacing either latch 20'B or one of latches 20B in clock domain 2 with the latch illustrated in FIG. 6 and described infra.

Figure 6:
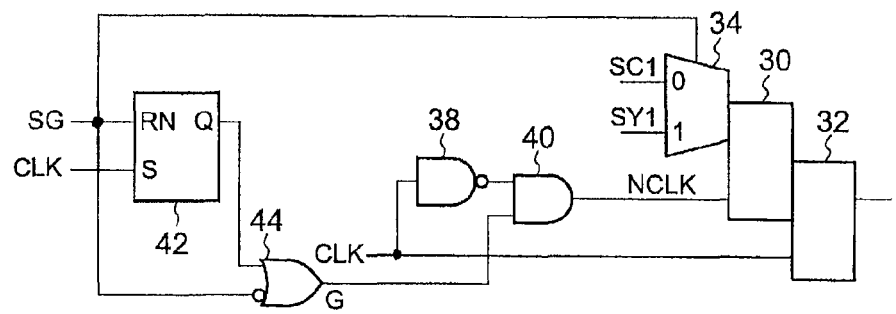
FIG. 6 is a circuit block diagram showing another embodiment of the scan latch according to the present invention.
Figure 7:
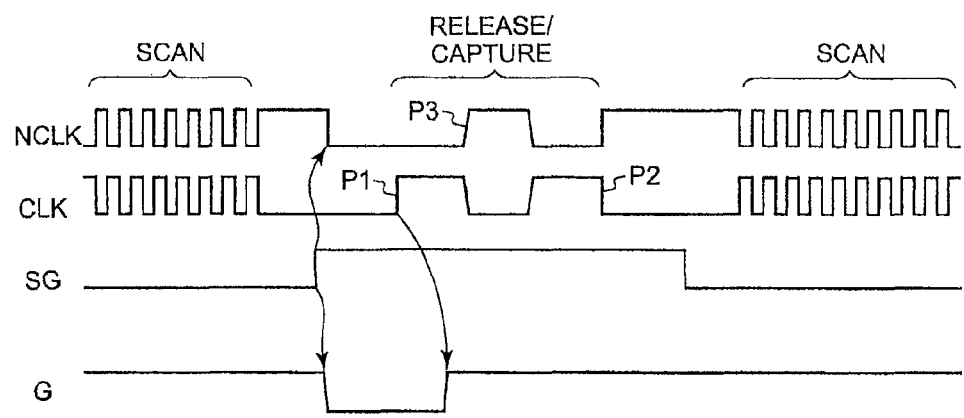
FIG. 7 is a waveform diagram showing a clock signal, a scan gate signal, and a gate control signal for controlling the scan latch of FIG. 6.

FIG. 6 is a circuit block diagram showing another embodiment of the scan latch according to the present invention and FIG. 7 is a waveform diagram showing a clock signal, a scan gate signal, and a gate control signal for controlling the scan latch of FIG. 6. The scan latch of FIG. 6 is similar to the scan latch of FIG. 4 except a gate control circuit comprised of a set/reset (SR) latch 42 and an OR gate 44 replaces the inverting circuit 42 of FIG. 4. The SR latch 42 contains a set input S and a reset input RN, the set input S over-riding the reset input RN. That is, while the set input S is enabled, the SR latch 42 can not be not reset. The SR latch 42 is supplied with the second clock CLK at the set input S and with the scan gate signal SG at the reset input RN. The scan gate signal SG is supplied to the selection input of the selector 34 and the inverted input of the OR gate 44, as well as to the reset input RN. The other input of the OR gate 44 is supplied with the output from the SR latch 42. The OR gate 44 generates a gate control signal G which is a logical addition of the output from the SR latch 44 and the inverted scan gate signal and supplies it to the second input of the AND gate 40.

The operation of the scan latch in FIG. 6 will best be understood by reference to a the waveform diagram in FIG. 7. The scan latch in FIG. 6 operates similarly to the scan latch in FIG. 4 in the scan mode when the scan gate signal SG is at the low level. When the scan gate signal SG transits to the high level indicating the normal operation mode, the SR latch 42 is reset because the second clock CLK from the clock generation circuit is set to the low level. As a result, both inputs of the OR gate 44 go to the low level and the gate control signal G also goes to the low level. Consequently, the second input of the AND gate 40 is disabled, so the master latch 30 holds the scan data loaded by the last first clock NCLK.

Next, when the release/capture clocks P1 and P2 arrive from the clock generation circuit, the slave latch 32 firstly releases the scan data held in the master latch 30 in response to the release clock P1. In addition, since the SR latch 42 is set, the gate control signal G from the OR gate 44 becomes the high level. As a result, the first clock NCLK becomes the high level when the release pulse P1 becomes the low level, and a pulse P3 permits the system input SYI to be captured by the master latch 30. In this case, no improper data problem can occurs even if the release/capture clock arrives later than the sending-side scan latch in the clock domain 10A (see FIG. 3). This is because the scan data is already released when the master latch 30 becomes ready for capturing.

When the scan latch in of FIG. 6 is used for latch 20B' of the receiving side at the clock domain boundary, it is possible to perform a complete scan test including the function path 24. When the scan latch of FIG. 6 is used to replace an internal scan latch 20B of clock domain 2 (see FIG. 3 the function path 24 can be tested from that point on.

At-speed test conventionally requires that the rising transition of the scan gate signal SG arrives at all the scan latches within one cycle, but if the scan latch in of FIG. 6 is used, the scan test can be performed without consideration for such timing restriction. This is because the scan latch itself generates a signal needed for the test, i.e., the gate control signal G. However, in order to correctly rise the gate control signal G, the transmission delay from the input of the second clock CLK to the SR latch 42 to the AND gate 40 needs to be limited to a half cycle or less. When the operating frequency is 2 GHz, for example, the transmission time only needs to be 250 picoseconds or less.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. An integrated circuit enabling a scan test using scan latches that selectively receive a scan input or a system input according to a mode selection signal, and comprising a plurality of clock domains where clocks for a test are supplied from a separate clock generation circuit, respectively, wherein in given clock domains, scan latches at a clock domain boundary configured to receive an output from other clock domains comprise a master latch configured to respond to a first clock signal and to latch an input;

a slave latch configured to respond to a second clock signal and to latch an output of said master latch;

a selector configured to supply a scan input to said master latch when a mode selection signal is at a first level, and to supply a system input to said master latch when said mode selection signal is at a second level; and a clock control circuit configured to turn off said first clock signal when said mode selection signal transits from said first level to said second level, wherein the clock control circuit comprises:

an inverting circuit configured to invert said second clock signal, an AND gate configured to receive an output of said inverting circuit to a first input, a gate control circuit configured to disable a second input of said AND gate when said mode selection signal transits from said first level to said second level; and an output of said AND gate becomes said first clock signal.

2. The integrated circuit of claim 1, wherein said scan latches at a clock domain boundary receive said second clock signal from the clock generation circuit of said given clock domains.

3. The integrated circuit of claim 1, wherein said gate control circuit is an inverting circuit configured to invert said mode selection signal.

4. The integrated circuit of claim 3, wherein said scan latches at a clock domain boundary receive an output from said scan latches of the other clock domains to said scan input and said system input.

5. The integrated circuit of claim 1, wherein said gate control circuit responds to a rising of said second clock signal and a second input of said AND gate is enabled when said mode selection signal is at said second level.

6. The integrated circuit of claim 5, wherein
the transition from said first level to said second level is a rising transition; and
said gate control circuit comprises
an SR latch configured to be set due to a rising of said second clock signal, and to be reset due to a rising of said mode selection signal when said second clock signal is off, and
an OR gate configured to receive an output of said SR latch and an inversion signal of said mode selection signal as an input, and to supply an output to a second input of said AND gate.

7. The integrated circuit of claim 5, wherein said scan latches at a clock domain boundary receive an output from said scan latches of the other clock domains to said scan input.

8. An integrated circuit enabling a scan test using scan latches that selectively receive a scan input or a system input according to a mode selection signal, and comprising a plurality of clock domains where clocks for a test are supplied from a separate clock generation circuit, respectively, wherein
in given clock domains, scan latches at a clock domain boundary configured to receive an output from other clock domains comprise
a master latch configured to respond to a first clock signal and to latch an input;
a slave latch configured to respond to a second clock signal and to latch an output of said master latch;
a selector configured to supply a scan input to said master latch when a mode selection signal is at a first level, and to supply a system input to said master latch when said mode selection signal is at a second level;

a clock control circuit configured to turn off said first clock signal when said mode selection signal transits from said first level to said second level; and an internal scan latch that is different from the master latch and the slave latch, the internal scan latch comprising:
a master latch configured to respond to a first clock signal and to latch an input,
a slave latch configured to respond to a second clock signal and to latch an output of said master latch,
a selector configured to supply a scan input to said master latch when said mode selection signal is at a first level, and to supply a system input to said master latch when said mode selection signal is at a second level,
an inverting circuit configured to invert said second clock signal,
an AND gate configured to receive an output of said inverting circuit to a first input,
an SR latch configured to be set due to a rising of said second clock signal, and to be reset due to a rising of said mode selection signal, and
an OR gate configured to receive an output of said SR latch and an inverting signal of said mode selection signal as an input, and to supply an output to a second input of said AND gate; and
an output of said AND gate becomes said first clock signal.

9. The integrated circuit of claim 8, wherein said internal scan latch receives said second clock signal from a clock generation circuit of a clock domain where said internal scan latch belongs.

10. An integrated circuit enabling a scan test using scan latches that selectively receive a scan input or a system input according to a mode selection signal, and comprising a plurality of clock domains where clocks for a test are supplied from a separate clock generation circuit, respectively, wherein
in given clock domains, scan latches at a clock domain boundary configured to receive an output from other clock domains comprise
a master latch at a receiving clock domain configured to respond to a first clock signal and to latch an input, wherein the first clock signal when turned on is an inverse of a second clock signal;
a slave latch at the receiving clock domain configured to respond to the second clock signal and to latch an output of said master latch;
a selector configured to supply a scan input to said master latch when a mode selection signal is at a first level, and to supply a system input to said master latch when said mode selection signal is at a second level; and
a clock control circuit configured to turn off said first clock signal when said mode selection signal transits from said first level to said second level.

* * * * *